United States Patent
Tagami et al.

[11] Patent Number: 6,034,036
[45] Date of Patent: Mar. 7, 2000

[54] METHOD OF MANUFACTURING OXIDE SUPERCONDUCTORS

[75] Inventors: Minoru Tagami, Kanagawa; Xin Yao, Iwate; Makoto Kambara, Tokyo; Yuh Shiohara, Kanagawa; Shoji Tanaka, Tokyo, all of Japan

[73] Assignees: International Superconductivity Technology Center; Ishikawajima-Harima Jukogyo Kabushiki Kaisha, both of Tokyo, Japan

[21] Appl. No.: 08/938,600

[22] Filed: Sep. 25, 1997

[30] Foreign Application Priority Data

Sep. 27, 1996 [JP] Japan ................................ 8-277436

[51] Int. Cl.$^7$ ................................ C30B 11/04
[52] U.S. Cl. ........................ 505/450; 505/451; 505/729
[58] Field of Search ................ 505/450, 451, 505/729

[56] References Cited

U.S. PATENT DOCUMENTS

| 5,440,040 | 8/1995 | Kojima et al. | 505/451 |
| 5,525,584 | 6/1996 | Murakami et al. | 505/450 |
| 5,550,102 | 8/1996 | Nakai et al. | 505/450 |

FOREIGN PATENT DOCUMENTS

| 319807 | 6/1989 | European Pat. Off. | 505/729 |
| 2-188500 | 7/1990 | Japan | 505/451 |
| 5-301797 | 11/1993 | Japan | 505/729 |
| 1515789 | 2/1988 | Russian Federation | 505/729 |

*Primary Examiner*—Robert Kunemund
*Attorney, Agent, or Firm*—Armstrong, Westerman, Hattori, McLeland and Naughton

[57] ABSTRACT

The present invention is aimed to provide a means for manufacturing a RE123 system oxide superconductor showing good superconductivity characteristics under atmospheric ambiance. In a method of manufacturing a RE123 system oxide superconductor by melting, cooling and solidifying material including rare-earth elements and a Ba—Cu—O solvent for crystallization such as by the crystal pulling method, examining beforehand the relationship between the melted material composition and the equilibrium liquid-phase composition and the crystal composition of the RE123 system oxide superconductor formed therefrom in atmospheric ambiance, and based on the result of said examination, adjusting the average composition of the material or the composition of the solvent (for example, setting the average composition of the material to an area where the superconductivity phase and the liquid phase coexist in equilibrium, and at the same time adjust the "Ba/Cu" ratio of the melted material to 3/5–1/1, or adjust the "Ba/Cu" ratio of the solvent inside the crystal pulling crucible to 3/5–1/1), in order to control the amount of mutual substitution between RE and Ba (control the value of x in RE123 system superconductor $RE_{1+x}Ba_{2-x}Cu_3O_{7-d}$ to 0–0.05 and the like) for crystallization.

9 Claims, 4 Drawing Sheets value of X in $RE_{1+x}Ba_{2-x}Cu_3O_{7-d}$

METHOD OF MANUFACTURING OXIDE SUPERCONDUCTORS

TECHNICAL FIELD OF THE INVENTION

The present invention relates to a method of manufacturing a RE123 system oxide crystal (superconductor) under atmospheric ambiance with advantageous superconductivity showing high critical temperature (above 90 K).

BACKGROUND OF THE INVENTION

Recently, the discovery of oxide superconductors having a critical temperature which is higher than liquid nitrogen temperature made application technique of superconductors popular, and there is a fierce competition on the development of materials showing stable superconductivity characteristics under high temperature.

Especially, the Y—Ba—Cu—O system superconductors of the 123 system oxide (oxide system material wherein the mol ratio of Y:Ba:Cu is 1:2:3) have succeeded in achieving a high critical current density by a unique method. The development of applications to bearings, flywheels, carrying devices and the like are thought of using the power of the "superconductor that can create a large electromagnetic power by the mutual operation with a magnetic field".

Further, other than Y123 system oxide superconductors, advantageous superconductivity characteristic are recognized in RE123 system oxides having a composition of various rare-earth elements (RE) instead of Y (yttrium). Research is going on for these oxides for the development of better superconductivity application equipment.

Conventionally, "flux method", "melt solidification method" and the like were used to manufacture Y123 system oxide superconductors and RE123 system oxide superconductors.

The "flux method" is a method of creating an oxide superconducting crystal from a solvent under its solubility limit by lowering the temperature continuously of a supersaturation solution having a relatively uniform material composition (flux: solvent) formed of a mixture of oxides. The "melt solidification method" is a method of creating an oxide superconducting crystal by heating the material composition (flux) to a temperature above the peritectic temperature of the object oxide in order to create a mixture of solid-phase and liquid-phase material, and then lowering the temperature continuously, provoking peritectic reaction.

Further, various single crystal growing methods such as "FZ method (floating zone melt method)", "unidirectional solidification method" and "crystal pulling method" are tested for application, and attention is given to the "crystal pulling method" which is advantageous for mass production.

This "crystal pulling method" is a representative method for manufacturing a single crystal continuously. The method manufactures an oxide superconducting single crystal by immersing seed crystal to the solution surface of a material composition kept at a melted state inside a crucible, growing superconducting single crystal on the seed crystal by the peritectic reaction at the solution/grain interface and gradually and continuously pulling out the single crystal from the solution in order to gain an oxide superconducting single crystal.

FIG. 1 is an explanatory view showing the method of manufacturing a single crystal by the "crystal pulling method".

In order to manufacture, for example, a Y123 system oxide single crystal by the "crystal pulling method", a Y—Ba—Cu—O system oxide (the crystal of a high-temperature-phase $Y_2Ba_1Cu_1O_5$ (Y211)) 2 is inserted to an yttria crucible 1 as a supply source of a solute Y (the material of the crucible not limited to yttria but any material such as magnesia, alumina, stabilized zirconia and the like of refractory material having resistability could be utilized as the crucible), and filling the area above it with a "solution 3 of a solvent mixing and pre-baking barium carbonate and copper oxide so that the mol ratio of Ba:Cu would be 3:5 (Ba/Cu=0.57)" and keeping the liquid-phase surface temperature between 960–1010° C., bringing a seed crystal stick 4 of a refractory material close to the liquid-phase surface, and contacting a thin film (seed crystal) 5 of Y123 grown using plasma evaporating method to a magnesia single crystal which will act as the seed of crystal growth fixed to the end of the seed crystal stick. Next, the seed crystal stick 4 is rotated in a speed of approximately 100 rpm and pulled to the upper direction by a speed of about 0.2 mm/hr, pulling out continuously a $YBa_2Cu_3O_{7-x}$ single crystal 6 grown using the $YBa_2Cu_3O_{7-x}$ crystal 5 as the seed.

The method of manufacturing a RE123 system oxide single crystal by a "crystal pulling method" is almost the same as in the above case of manufacturing said Y123 system oxide single crystal. However, in this case, the aimed RE system oxide is used as the seed crystal, and normally as the supply source of RE (rare-earth element) solute, either a RE422 ($RE_4Ba_2Cu_2O_{10}$) or a RE211 composed RE—Ba—Cu—O system oxide is inserted to the crucible, or a $RE_2O_3$ crucible is used to supply RE solute.

However, the 123 system oxide superconductors manufactured by the above described methods show a relatively fine superconductivity by the Y123 system, but there was a problem that the RE123 system superconductors did not show very high critical temperature.

The reason for such phenomenon was thought to be that the chemical composition of the gained RE123 crystal was excluded from the composition of 123 phase with a value of x being 0 to 0.05, since the ionic radii of rare-earth elements (RE) was relatively large and thus close to the ionic radii of Ba, resulting in the occurrence of the mutual substitution of RE and Ba at the time of creating a superconductivity phase by cooling/solidifying the melted material.

FIG. 2 is a "$1/2RE_2O_3$—BaO—CuO ternary system status view" showing oxides under the atmospheric environment including RE (La, Nd, Sm, Pm, Eu, Gd and the like) having a relatively large ionic radii. As is shown in FIG. 2, a "solid solution zone having width" exists along the line extending from the RE123 phase to the upper right direction. This solid solution zone exists because under atmospheric ambiance, $RE_{1+x}Ba_{2-x}Cu_3O_y$ (x>0, 6.0<y<7.2) phase becomes stable shifting from the RE123 phase. As was described, and as could be understood from the existence of said solid solution zone, in an oxide including RE having a relatively large ionic radii, the mutual substitution of RE and Ba occurs when solidifying and growing superconductivity phase under atmospheric ambiance.

As is shown in FIG. 3, the superconductivity of the RE123 system oxide superconductor changes according to the amount of substitution x of RE and Ba, wherein the larger the amount of substitution x, the lower the critical temperature, and in contrast, the smaller the amount of substitution x (that is, with a composition close to RE123 oxide), the higher the critical temperature.

As was explained above, one cause of the prevention of the achievement of high critical temperature was the mutual substitution between RE and Ba occurring at the step of growing a superconducting phase by cooling and solidifying the melted material (the step of nucleus creation and growth).

Then, an "OCMG method (method of melt solidification under low oxygen ambiance)" was suggested wherein the amount of oxygen included in the ambiance is controlled to be low when the melt and solidification of the material flux is performed to grow crystals.

However, the 123 system oxide superconductors created by this OCMG method is accompanied by a very disadvantageous manufacturing problem, because even though a RE123 with high critical temperature could be gained with small amount of substitution having a narrow width of the amount of Ba substitution under low oxygen partial pressure ambiance, it is disadvantageous that it has to be manufactured under a controlled low oxygen ambiance.

Therefore, the object of the present invention is to provide a method of manufacturing a RE123 system oxide superconductor under atmospheric ambiance without having to control the ambiance, showing a great superconductivity with a very small amount of mutual substitution between RE and Ba, having a critical temperature of higher than 90 K and with a narrow superconducting transition width $\Delta T$.

SUMMARY OF THE INVENTION

From the research for accomplishing the above mentioned object, the inventors of the present invention have discovered a new knowledge.

That is, in the prior art, in order to grow Y123 system oxide superconducting phase by melting, cooling and solidifying material including the crystal pulling method, the Ba:Cu mol ratio of the flux normally being used was somewhere around 3:5 (Ba/Cu=0.57) concerning the mass balance inside the crucible with a peritectic reaction (Y211+ $Ba_3Cu_5O_8 \rightarrow Y123$), since there were no mutual substitution between Y and Ba. Also in the growth of RE123 system oxide superconducting phase, a flux with the same 3:5 Ba:Cu mol ratio (Ba/Cu=0.57) was used.

Further, there was a tendency to empower the richness of Cu by reducing the Ba/Cu ratio of the flux even further, because it was thought that a flux having a small Ba/Cu ratio and Cu rich had greater solubility of the solute (RE) increasing the growth speed of the RE123 system oxide crystals.

However, in the growth of RE123 system oxide superconducting phase under atmospheric ambiance, there exists a solid solution zone with width by the mutual substitution between RE and Ba as was previously explained, and maybe by the creation of "RE123 having mutual substitution of RE and Ba", the created RE123 system oxide superconductors did not have sufficient superconductivity characteristic (critical temperature and the like), and this tendency of reduced superconductivity characteristic was outstanding when flux having the small Ba/Cu ratio to increase the growth speed of the crystal was used to grow the superconductor.

When research was going on regarding this phenomenon, a phenomenon which was absolutely contrary to the prior knowledge was discovered. That is, in the RE123 system, when the flux was Ba rich with a high ratio of Ba/Cu, the superconductivity characteristics of the gained RE123 system oxide superconductors was remarkably improved.

Therefore, the present inventors probed the phenomenon, and by making the most of the highest technique, very long time and manpower, succeeded in the creation of a ternary system status figure of a detailed $REO_{1.5}(1/2RE_2O_3)$—BaO—CuO which was unknown.

By further research based on this ternary system status view, it was clearly confirmed that there was a close and clear relationship between the crystal composition and the liquid-phase composition (melt flux composition) in the "area where the superconducting phase and the liquid-phase exist in equilibrium" at a step where the RE123 system oxide superconducting melted materials are being cooled, and that "the composition of the crystal is necessarily decided when the liquid-phase composition is decided" and "the relationship between the liquid-phase composition and the Ba—Cu—O solvent composition" was discovered.

In other words, the inventors discovered that by adjusting the solvent composition, the "amount of mutual substitution between RE and Ba in a gained RE123 system oxide superconductor" could be controlled.

Therefore, by understanding in advance the relationship (tie line) between the crystal composition in the area where the superconducting phase and the liquid-phase exist in equilibrium under atmospheric ambiance and the liquid-phase composition, and the relationship between the liquid-phase composition and the solvent composition, the RE123 itself, or the solvent composition for growing RE123 superconducting phase having "the aimed amount of substitution" in atmospheric ambiance could be calculated.

Then, by melting, cooling and solidifying the solvent having said composition and the material including rare-earth elements to crystallize a RE123 system oxide superconducting phase, a RE123 system oxide superconductor crystal having a very small amount of mutual substitution between RE and Ba could be manufactured under atmospheric ambiance.

By further studies based on the above knowledge, the finding that "in order to obtain an advantageous superconductivity character by restraining the amount of mutual substitution between the RE and Ba of the RE123 system oxide superconductor to be manufactured, it is appropriate to increase the "Ba/Cu" ratio of the liquid-phase (melted flux or melted material) from which the superconductor crystal is created to the area higher than that of the prior application so that it is Ba rich" was reconfirmed from the "status view of which the detail has been clearly discovered for the first time". Further, the "bad influence to the crystal growth speed" feared by the "Ba/Cu" ratio of the liquid-phase being Ba rich was not so much of a problem in practice since, for example, when "crystal pulling method" is applied, the condition such as the pulling speed and the like could be controlled relatively at will, and even when methods other than the crystal pulling method is utilized, such as the "flux method" and the like, the increase of superconductivity characteristic was more than effective to cancel the somewhat slow speed of crystal growth.

The present invention, based on the above knowledge, was completed by incorporating the idea that "the crystal pulling method is suitable for effective mass production and is advanced industrially of all the growing methods of oxide superconducting single crystal, and it is easier to control the elements of the flux (melted material)". The present invention provides the method of manufacturing a RE123 system oxide superconductor as follows.

(1) A method of manufacturing an oxide superconductor having high critical temperature in atmospheric ambiance wherein "material including one or two kinds of rare-earth elements as a composition element" acting as the solute supply source and a Ba—Cu—O solvent are melted, cooled and solidified to manufacture a RE123 system oxide superconductor, characterized in that a "relationship between the solvent composition and a liquid-phase composition and a crystal composition of the RE123 system oxide superconductor grown therefrom" is examined in atmospheric ambiance beforehand, and then based on the examination result, adjusting the solvent composition in order to control the amount of mutual substitution between Re and Ba, and performing crystallization.

(2) A method of manufacturing an oxide superconductor having high critical temperature in atmospheric ambiance wherein material including one or two kinds of rare-earth elements as a composition element and a Ba—Cu—O solvent are melted to manufacture a RE123 system oxide superconductor by a crystal pulling method, characterized in that a "relationship between a composition of said melted material portion and an equilibrium liquid-phase composition and a crystal composition of the RE123 system oxide superconductor grown therefrom" is examined in atmospheric ambiance beforehand, and then based on the examination result, setting an average composition of said material to be in "an area where a superconductivity phase and the liquid-phase coexist in equilibrium", and adjusting a "Ba/Cu" ratio of said melted material in order to control the amount of mutual substitution between Re and Ba, and performing crystallization.

(3) The method of manufacturing an oxide superconducting single crystal having high critical temperature in atmospheric ambiance of said (1) or (2) wherein said rare-earth element (RE) is "one kind or more than two kinds having a large ionic radii which is close to the ionic radii of Ba".

(4) The method of manufacturing an oxide superconducting single crystal having high critical temperature in atmospheric ambiance of said (1) through (3) wherein the manufacture RE123 system superconductor comprises of a crystal composition of $RE_{1+x}Ba_{2-x}Cu_3O_{7-d}$ ($0 \leq x \leq 0.05$).

(5) The method of manufacturing an oxide superconducting single crystal having high critical temperature in atmospheric ambiance of said (1) or said (3) through (4) wheren the "Ba/Cu" ratio of said solvent is adjusted to be in the range of "3/5" through "1/1".

(6) The method of manufacturing an oxide superconducting single crystal having high critical temperature in atmospheric ambiance of said (2) through (4) wherein the "Ba/Cu" ratio of the melted material is adjusted to be in the range of "3/5" through "1/1".

In the above, the RE123 system oxide superconductor of the present invention could be any crystal system superconductor wherein the RE is one kind or more than two kinds of Nd, La, Sm, Pm, Eu, Gd and the like shown by the chemical formula "$RE_{1+x}Ba_{2-x}Cu_3O_{7-d}$". Said Nd, La, Sm, Pm, Eu and Gd have a large ionic radii which is close to the ionic radii of Ba, and mutual substitution between Ba is easily performed, so the effect of applying the present invention is remarkable.

Further, on manufacturing a "$RE_{1+x}Ba_{2-x}Cu_3O_{7-d}$" superconductor by the present method, the value of x in the formula should be aimed in the range of "$0 \leq x \leq -0.05$", by which a material having an advantageous superconductivity characteristic could be gained.

Further in order to limit the value of x in said formula to a smaller value, the "Ba/Cu" ratio of the melted solvent or of all material should be adjusted to "3/5" through "1/1". By such adjustment, the value of x could be limited to a smaller value, and a material having better superconductivity characteristics could be gained.

Further, the "method of growing a RE123 system oxide superconductor by cooling and solidifying melted material (melted flux) and crystallizing the same" according to the present invention is not limited to a special method, and any method for forming a RE123 superconductivity phase via a liquid-phase such as the "crystal pulling method" and the "flux method" could be applied, and there is a possibility of applying even methods such as "melt solidification method", "FZ method" and "unidirectional solidification method".

DETAILED DESCRIPTION

Next, the present invention is further explained in detail of its effect by the embodiment.

In the present embodiment, the manufacturing of the Nd123 system oxide superconductor by the present method is explained.

Previous to the manufacturing of Nd123 system oxide superconducting crystal, the relationship between the "$Nd_{1+x} Ba_{2-x}Cu_3O_{7-d}$ crystal composition" and "the liquid-phase composition and the solvent composition which is equilibrium to said crystal composition" was examined.

The examination employed the method where $Nd_2O_3$, $BaCO_3$ and CuO powder as material was melted and kept inside a magnesia crucible for a period of time and then cooled rapidly.

Figure 4:
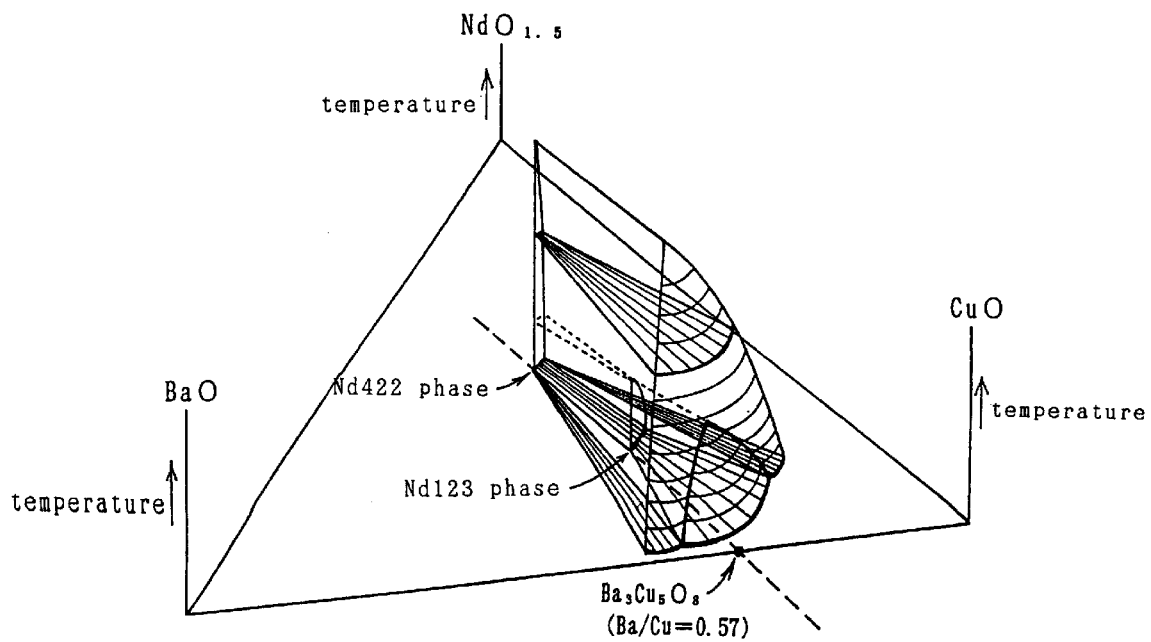
FIG. 4 is a three-dimentional ternary equilibrium status view showing the relationship between $Nd_{1+x}Ba_{2-x}Cu_3O_{7-d}$ crystal composition and the liquid composition under atmospheric ambiance.
Figure 5:
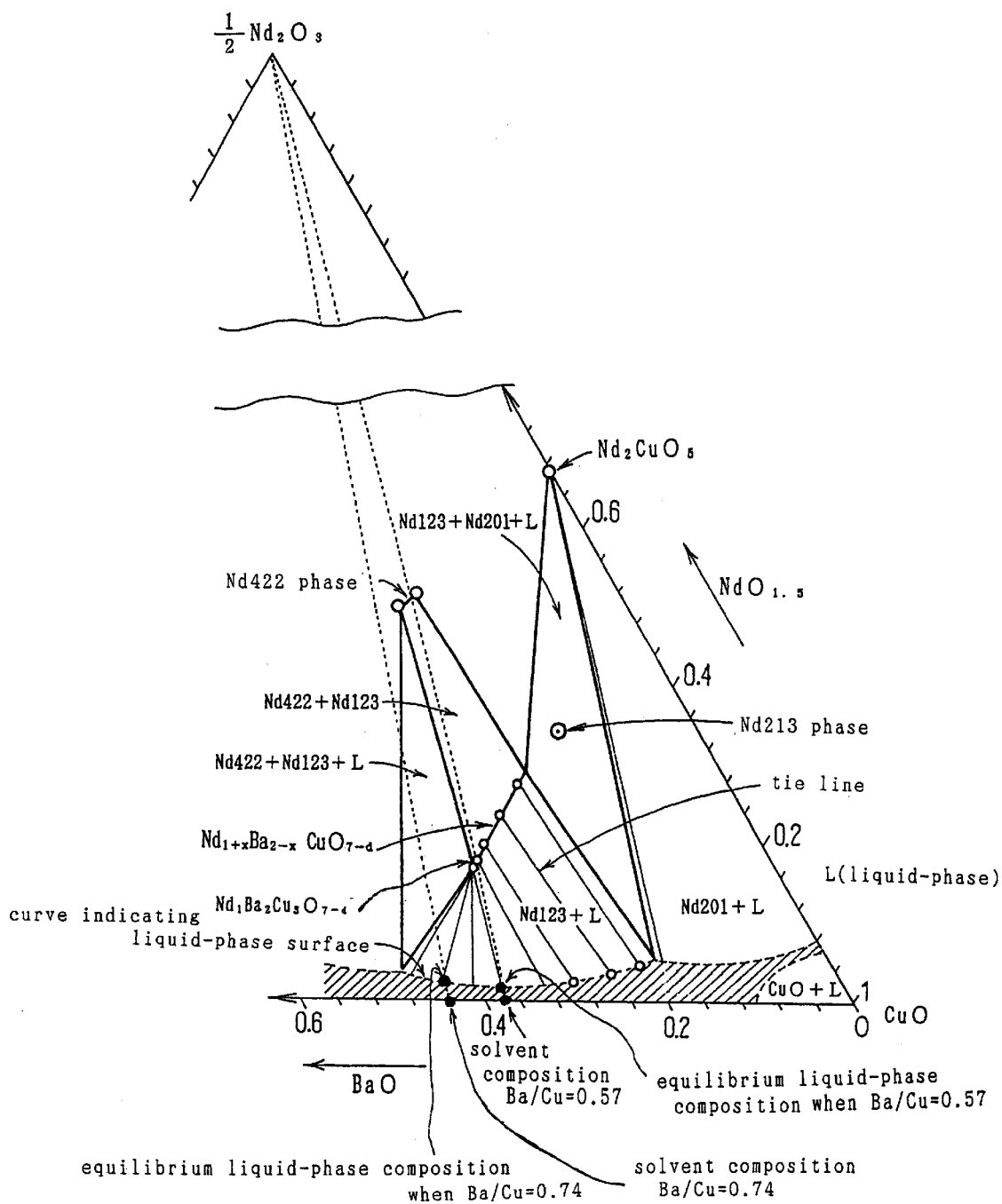
FIG. 5 is a detailed view of the main portion of "a constant temperature member" of the ternary equilibrium status view of FIG. 4.

FIG. 4 shows the "relationship between the $Nd_{1+x}Ba_{2-x}Cu_3O_{7-d}$ crystal composition and the liquid-phase composition in atmospheric ambiance" gained by the above examination in three-dimentional ternary equilibrium status view. FIG. 5 is a detailed view showing the main portion of "a constant temperature member" of FIG. 4.

From the examination result (status view: for example, FIG. 5), the relationship (tie line) between the crystal composition and the liquid-phase composition under atmospheric ambiance in the range where the superconductivity phase and the liquid-phase exist in equilibrium could be understood.

Further, when $Nd_2O_3$ crucible is used as the solute providing source, the material composition inside said crucible would appear on the straight line connecting $Nd_2O_3$ and the solvent composition, and the crossing point with said straight line and the liquid-phase surface (the curved line connecting the equilibrium liquid-phase composition) is known to be the equilibrium liquid-phase composition when utilizing this solvent composition. In other words, the relationship between the solvent composition and the liquid-phase composition is understood. Therefore, by considering the tie line, the relationship between the solvent composition and the composition of RE123 being grown could be understood.

By using the flux where Ba/Cu=0.74 (Ba:Cu being approximately 3:4) by this status view, the crystal having a similar composition to RE123 (x=0.02) could be grown.

Figure 1:
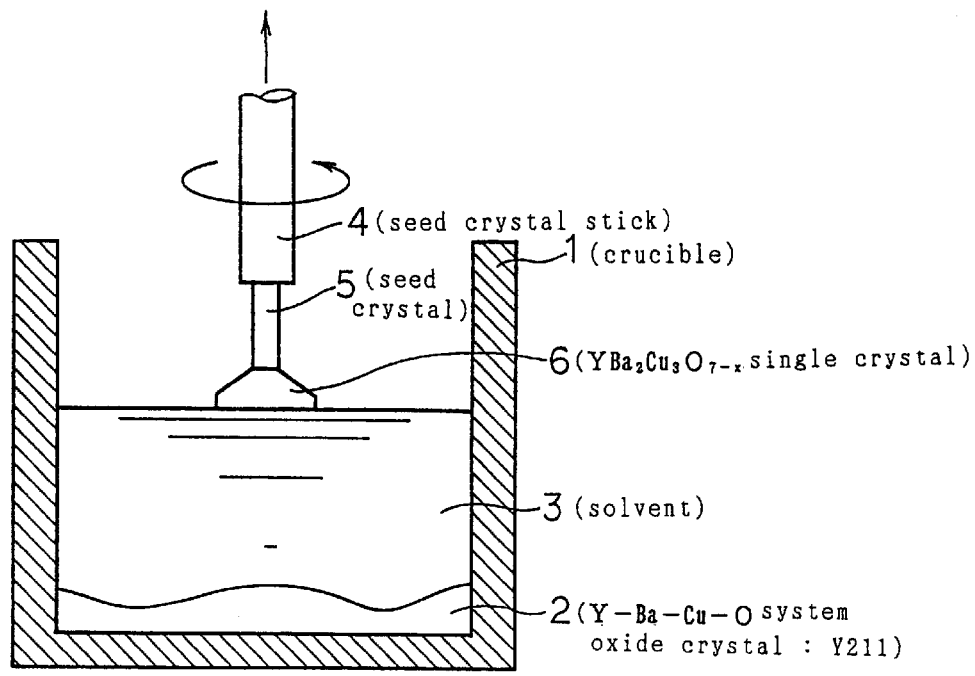
FIG. 1 is an explanatory view showing the manufacturing method of a Y123 system oxide single crystal by the crystal pulling method.
Figure 2:
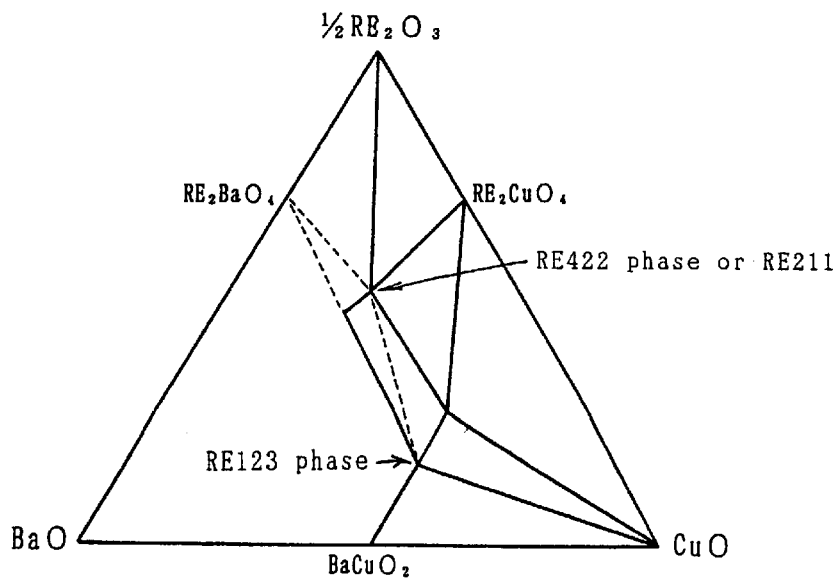
FIG. 2 is a ternary status view of $1/2RE_2O_3$—BaO—CuO.
Figure 3:
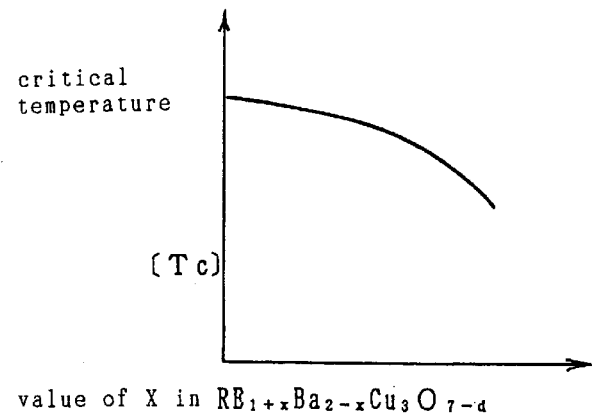
FIG. 3 is a graph explaining the relationship between the value x of a $RE_{1+x}Ba_{2-x}Cu_3O_{7-d}$ superconductor and the critical temperature.

Therefore, based on this examination result, the growing of Nd123 system oxide superconducting single crystal was tested by a crystal pulling method similar as the method shown in FIG. 1.

That is, a $Nd_2O_3$ crucible is used as the "crucible" also serving as the supply source of Nd, and a powder of $BaCO_3$ and CuO mixed to have a "Ba:Cu" ratio of approximately 3:4 (Ba/Cu=0.74) is introduced thereto. Then, solvent is filled to the crucible, then it is heated and melted, and then the solution is kept to a growing temperature of 1060° C. under atmospheric ambiance.

The "Nd123 thin film formed by a plasma evaporation method on a MgO single crystal" is used as the seed crystal, and the seed crystal is soaked to the solution surface and rotated by a rotation speed of 120 rpm, so that the solution including a solute Nd provided by the $Nd_2O_3$ crucible around it is cooled and solidified to grow a crystal, and it is pulled continuously to the upper direction by a speed of 0.2 mm/hr keeping said status to manufacture a single crystal.

When doing so, "manufacturing test using a flux of Ba/Cu=0.74 based on said pre-examination result" as the embodiment of the present invention and "manufacturing test using a flux of Ba/Cu=0.57 employed in the prior art according to the study from Y123 system superconducting single crystal growth" as the comparative embodiment was performed.

Then, conventional heat processing (annealing) in the oxygen flow of 340° C. for 200 hours was performed to each of said gained single crystal.

Then, sample was cut out from each single crystal after said heat processing, and they were examined of the amount of mutual substitution between Nd and Ba (the value of x in $Nd_{1+x}Ba_{2-x}Cu_3O_{7-d}$ crystal) by inductively coupled plasma analysis (ICP). The amount of substitution x in the Nd123 system superconductor manufactured according to the method of the present invention was 0.015 which was approximately the same as the value x=0.02 predicted by the status view, confirming that a strict control was possible for the amount of substitution.

In contrast, the sample gained by using the flux of Ba/Cu=0.57 (Ba:Cu=3:5) as the comparative embodiment (prior art embodiment) showed a high amount of mutual substitution where x=0.065.

Figure 6:
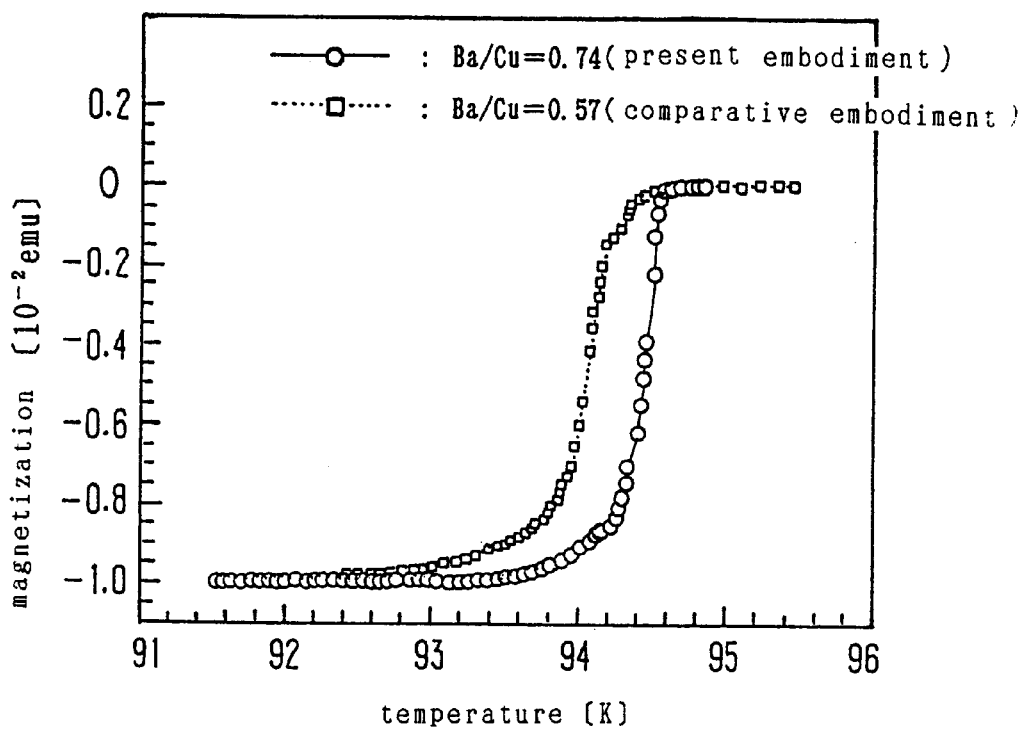
FIG. 6 is a graph showing the examination results of the superconductivity characteristics of the Nd123 superconductor gained by the present embodiment.

Further, the result of the examination of superconductivity characteristic of the samples cut out from each single crystal having been heat-processed is shown in FIG. 6.

From the result shown in FIG. 6, it could be recognized that the critical temperature of the Nd123 superconductor of the present invention formed using a flux of Ba/Cu=0.74 is approximately 95 K, which is better than that of the comparison embodiment formed using a flux of Ba/Cu=0.57. Further, the superconductivity transition width ΔT is 1.5 K in the comparison embodiment, but is as narrow as 0.5 K in the Nd123 superconductor of the present invention. These results show that the Nd123 superconductor gained by the present invention shows very advantageous superconductivity characteristics.

In the present embodiment, the crystal pulling method of a Nd123 superconductor was explained. However, even when other methods such as the flux method or the melt solidification method is used, or even when RE123 system superconductors applying RE other than Nd (La, Sm, Pm, Eu, Gd and the like) is manufactured, the application of the present method is confirmed to be effective.

As was explained above, by the method of the present invention, a RE123 system oxide superconductor showing great superconductivity characteristics having a critical temperature over 90 K and with a narrow superconductivity transition width ΔT could be manufactured under atmospheric ambiance, which is industrially effective.

We claim:

1. A method of manufacturing an oxide superconductor having high critical temperature in atmospheric ambiance, comprising:

determining in a preliminary step a relationship between (i) a composition of a Ba—Cu—O-containing solvent, (ii) a composition of an equilibrium liquid-phase of a melted composition comprising (a) material including at least one kind of rare-earth elements (RE) as a composition element and (b) said Ba—Cu—O-containing solvent and (iii) a composition of a crystal of a RE123 system oxide superconductor grown from said melted composition in atmospheric ambiance, for at least two different Ba/Cu molar ratios of said Ba—Cu—O-containing solvent, after said preliminary step, providing a starting composition comprising (a) starting material including at least one kind of rare-earth elements as a composition element and (b) a starting Ba—Cu—O-containing solvent, adjusting the Ba/Cu molar ratio of said starting Ba—Cu—O-containing solvent in order to control the amount of mutual substitution between the at least one kind of rare-earth elements and Ba based on said relationship, and performing crystallization in atmospheric ambiance, wherein said starting composition is melted, cooled and solidified to manufacture a RE123 system oxide superconductor.

2. A method of manufacturing an oxide superconducting single crystal having high critical temperature in atmospheric ambiance, comprising:

determining in a preliminary step a relationship between (i) a composition of a melted composition comprising (a) melted material including at least one kind of rare-earth elements (RE) as a composition element and (b) a Ba—Cu—O-containing solvent, (ii) a composition of an equilibrium liquid-phase of said melted composition and (iii) a composition of a crystal of a RE123 system oxide superconductor grown from said melted composition in atmospheric ambiance, for at least two different Ba/Cu molar ratios of said Ba—Cu—O-containing solvent, after said preliminary step, providing a starting composition comprising (a) starting material including at least one kind of rare-earth elements as a composition element and (b) a starting Ba—Cu—O-containing solvent, setting an average composition of said starting composition to be in an area where a superconductivity phase and a liquid-phase coexist in equilibrium, adjusting a Ba/Cu molar ratio of said starting composition in order to control the amount of mutual substitution between the at least one kind of rare-earth elements and Ba based on said relationship, and performing crystallization in atmospheric ambiance, wherein said starting composition is melted and a RE123 system oxide superconducting single crystal is manufactured by a crystal pulling method.

3. The method of manufacturing an oxide superconducting single crystal having high critical temperature in atmospheric ambiance of claims 1 or 2 wherein said rare-earth element (RE) is "one kind or more than two kinds having a large ionic radii which is close to the ionic radii of Ba".

4. The method of manufacturing an oxide superconducting single crystal having high critical temperature in atmospheric ambiance of claims 1 or 2 wherein the manufactured RE123 system superconductor comprises a crystal composition of $RE_{1+x}Ba_{2-x}Cu_3O_{7-d}$ ($0 \leq x \leq 0.05$).

5. The method of manufacturing an oxide superconducting single crystal having high critical temperature in atmospheric ambiance of claims 1 or 2 wherein:

said rare-earth element (RE) is "one kind or more than two kinds having a large ionic radii which is close to the ionic radii of Ba"; and the manufactured RE123 system superconductor comprises a crystal composition of $RE_{1+x}Ba_{2-x}Cu_3O_{7-d}$ ($0 \leq x \leq 0.05$).

6. The method of manufacturing an oxide superconducting single crystal having high critical temperature in atmospheric ambiance of claims 1 or 2 wherein the "Ba/Cu" ratio of said solvent is adjusted to be in the range of "3/5" through "1/1".

7. The method of manufacturing an oxide superconducting single crystal having high critical temperature in atmospheric ambiance of claims 1 or 2 wherein;

said rare-earth element (RE) is "one kind or more than two kinds having a large ionic radii which is close to the ionic radii of Ba"; and the "Ba/Cu" ratio of said solvent is adjusted to be in the range of "3/5" through "1/1".

8. The method of manufacturing an oxide superconducting single crystal having high critical temperature in atmospheric ambiance of claims 1 or 2 wherein:

the manufactured RE123 system superconductor comprises a crystal composition of $RE_{1+x}Ba_{2-x}Cu_3O_{7-d}$ ($0 \leq x \leq 0.05$); and the "Ba/Cu" ratio of said solvent is adjusted to be in the range of "3/5" through "1/1".

9. The method of manufacturing an oxide superconducting single crystal having high critical temperature in atmospheric ambiance of claims 1 or 2 wherein:

said rare-earth element (RE) is "one kind or more than two kinds having a large ionic radii which is close to the ionic radii of Ba";

the manufactured RE123 system superconductor comprises a crystal composition of $RE_{1+x}Ba_{2-x}Cu_3O_{7-d}$ ($0 \leq x \leq 0.05$); and the "Ba/Cu" ratio of said solvent is adjusted to be in the range of "3/5" through "1/1".

* * * * *